US009818868B2

United States Patent
Appaswamy et al.

(10) Patent No.: US 9,818,868 B2
(45) Date of Patent: Nov. 14, 2017

(54) METAL OXIDE SEMICONDUCTOR AND METHOD OF MAKING

(71) Applicant: Texas Instruments Incorporated, Dallas, TX (US)

(72) Inventors: Aravind C. Appaswamy, Dallas, TX (US); Akram A. Salman, Plano, TX (US); Farzan Farbiz, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/543,123

(22) Filed: Nov. 17, 2014

(65) Prior Publication Data

US 2015/0145040 A1  May 28, 2015

Related U.S. Application Data

(60) Provisional application No. 61/908,295, filed on Nov. 25, 2013.

(51) Int. Cl.
| | |
|---|---|
| *H01L 29/78* | (2006.01) |
| *H01L 29/66* | (2006.01) |
| *H01L 29/45* | (2006.01) |
| *H01L 29/06* | (2006.01) |
| *H01L 27/02* | (2006.01) |

(52) U.S. Cl.
CPC ........ *H01L 29/7835* (2013.01); *H01L 27/027* (2013.01); *H01L 29/0696* (2013.01); *H01L 29/456* (2013.01); *H01L 29/66659* (2013.01)

(58) Field of Classification Search
CPC  H01L 27/085; H01L 29/7833; H01L 29/6659
See application file for complete search history.

(56) References Cited

U.S. PATENT DOCUMENTS

| | | | |
|---|---|---|---|
| 8,071,436 B2* | 12/2011 | You ................ | H01L 21/823814 257/E21.633 |
| 8,664,728 B2* | 3/2014 | Lu et al. ............ | 257/392 |
| 2008/0061368 A1* | 3/2008 | Williams .......... | H01L 21/761 257/336 |
| 2013/0264640 A1 | 10/2013 | Salman et al. | |

OTHER PUBLICATIONS

Appaswamy, Aravind; Farbiz, Farzan; Salman, Akram.; "Novel Area-Efficient Techniques for Improving ESD Performance of Drain Extended Transistors," International Reliability Physics Symposium (IRPS) 2014, Jun. 1, 2014, 7 pages.

* cited by examiner

*Primary Examiner* — Fernando L Toledo
*Assistant Examiner* — Lawrence-Linh T Nguyen
(74) *Attorney, Agent, or Firm* — Jacqueline J. Garner; Charles A. Brill; Frank D. Cimino (57) ABSTRACT

A drain extended metal oxide semiconductor (MOS) includes a substrate having a semiconductor. A gate is located on the semiconductor, a source is located on the semiconductor and on one side of the gate, and a drain is located on the semiconductor and on another side of said gate. The MOS includes least one first finger having a first finger drain component located adjacent the drain, the first finger drain component has a silicide layer. At least one second finger has a second finger drain component located adjacent the drain, the second finger drain component has less silicide than the first finger drain component.

20 Claims, 6 Drawing Sheets

METAL OXIDE SEMICONDUCTOR AND METHOD OF MAKING

This application claims priority to U.S. provisional patent application 61/908,295 for A NEW ESD ROBUST DMOS DEVICE of Aravind C. Appaswamy filed on Nov. 25, 2013, which is hereby incorporated for all that is disclosed therein.

BACKGROUND

Drain-extended metal oxide semiconductor (DEMOS) devices are extensively used in analog technologies as interfaces between low-voltage processing circuitry and high-voltage off-chip devices. The use of DEMOS devices as interface elements implies that they are often in the critical path for electro static discharge (ESD) events. DEMOS devices are well known to have poor drain-to-source ESD current handling capability due to kirk-effect induced voltage snapback. The poor ESD current handling capabilities of the DEMOS devices and their locations in the critical paths for ESD events results in the DEMOS devices having significant failure rates.

The current ESD protection strategy for DEMOS devices involves either using parallel ESD clamps or relying on self protection. Parallel ESD clamps provide a route for the current generated during an ESD event to bypass terminals on the DEMOS devices, such as the drain/source path. The addition of parallel ESD clamps often requires significant area overhead on the integrated circuit on which the DEMOS devices are fabricated and may impose limitations on the maximum slew-rate of output signals generated by the DEMOS devices. In some situations, unanticipated failures may occur as a result of race conditions between the protected DEMOS devices and the ESD clamps.

Self protection relies on keeping the DEMOS devices turned on during ESD events, which clamps the voltage on the device terminals during ESD events. However, the gate voltages of the DEMOS devices cannot be guaranteed to stay high during ESD events, mainly due to parasitic paths and circuit loading. Therefore, self protection is achieved only by relying on the current handling capability of the device in breakdown mode, referred to as IT1, with zero gate to source voltage ($V_{GS}$). Relying on self protection in breakdown mode requires the protected device being physically large enough to pass the IT1 current. Some devices require a total DEMOS device width greater than 10,000 um for 2 kV in the human body model (HBM), and require the breakdown current IT1 to scale with the DEMOS device width and the number of gate fingers. The large sizes of the DEMOS devices increase the costs of the devices and present other problems.

SUMMARY

A drain extended metal oxide semiconductor (MOS) includes a substrate having a semiconductor. A gate is located on the semiconductor, a source is located on the semiconductor and on one side of the gate, and a drain is located on the semiconductor and on another side of said gate. The MOS includes at least one first finger having a first finger drain component located adjacent the drain, the first finger drain component has a silicide layer. At least one second finger has a second finger drain component located adjacent the drain, the second finger drain component has less silicide than the first finger drain component.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1:
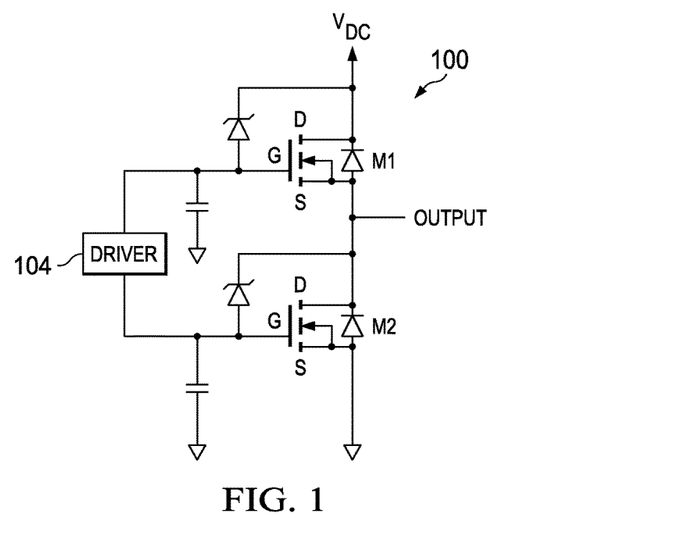
FIG. 1 is a schematic diagram of an example of a cascoded output stage of a gate driver.

Drain-extended metal oxide semiconductor (DEMOS) devices that are able to withstand the effects of current generated during some electrostatic discharge (ESD) events are disclosed herein. DEMOS devices are used extensively in analog technologies as interfaces between low voltage processing circuitry and high voltage off-chip devices. The use of DEMOS devices as interface elements implies that they are often in the critical path of high current generated during ESD events. Reference is made to FIG. 1, which is a schematic diagram of an example of a cascoded output stage 100 of a gate driver 104. The output stage 100 of FIG. 1 may be used in a motor control or similar device. The output stage 100 includes an isolated DEMOS device M1 that is cascoded with a non-isolated DEMOS device M2. An isolated DEMOS device means that the body and source are isolated from ground. The isolated DEMOS device M1 is located between a voltage supply $V_{DC}$ and the output. The non-isolated DEMOS device M2 is located between the output and ground.

The DEMOS devices M1 and M2 are in the critical path for ESD events. For example, an ESD event that causes stress between the output and the ground directly stresses the drain junction of the DEMOS device M2. In addition, an ESD event that causes stress between the voltage supply $V_{DC}$ and the ground may stress the drain junction and the gate of the DEMOS device M1. If the stresses generate large currents, the large currents may cause the DEMOS devices M1 and/or M2 to fail. The devices and methods described herein reduce the effects of ESD events on DEMOS devices.

Figure 2:
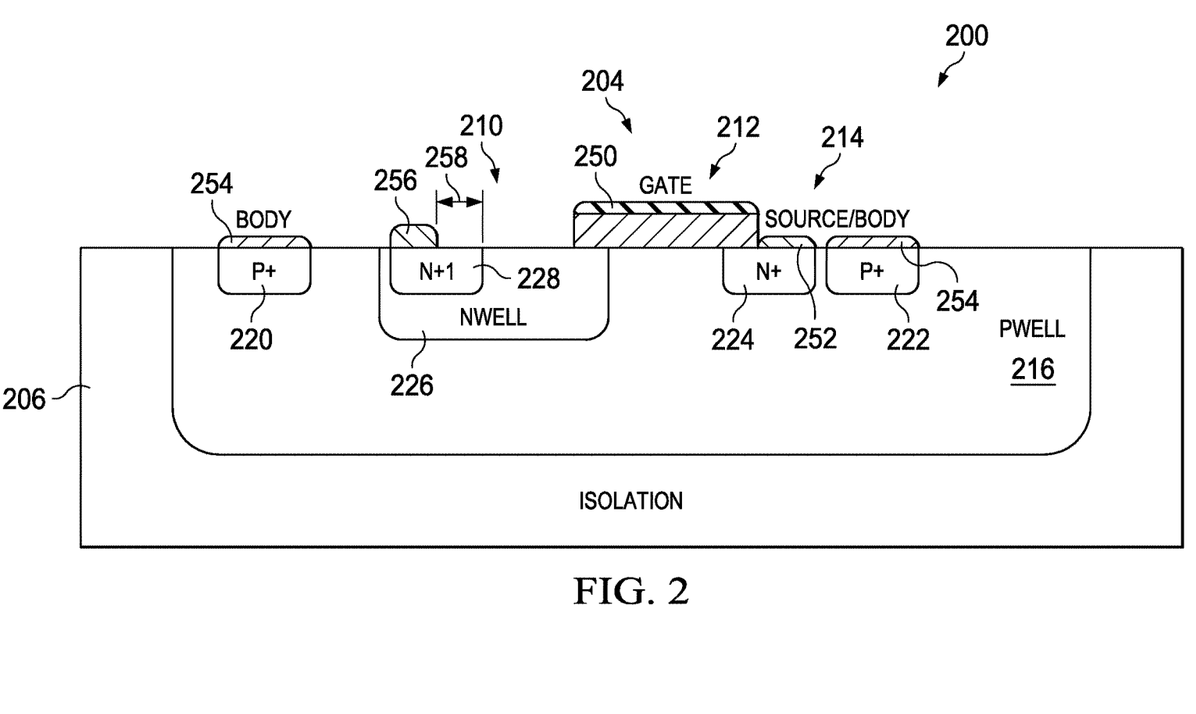
FIG. 2 is a cross sectional view of an example of an isolated DEMOS device.

FIG. 2 is a cross sectional view of an example of an isolated DEMOS device 200. Other circuitry on the DEMOS device may be positioned lateral to the view of FIG. 2, such as conventional transistors, resistors, diodes and capacitors. The methods and devices described herein are applicable to DEMOS devices having different layouts from the device 200. The isolated DEMOS device 200 includes a DEMOS transistor 204 that is at least partially encircled by or isolated by isolation material 206, which is sometimes referred to as the isolation 206. The DEMOS transistor 204 includes a drain 210, a gate 212, and a source 214 formed or fabricated into a body 216. The body 216 may be a semiconductor material that is doped and may have other fabrication processes applied thereto. In the example of FIG. 2, the body 216 is doped as a Pwell region. The cross sectional view of FIG. 2 shows two body contact regions 220 and 222 that are doped P+, which means that they are doped highly positive. The source 214 is a highly negatively doped N+ region 224. Accordingly, the transistor 304 is an NPN type device. The devices and methods described herein may be applicable to PNP type devices that have the opposite doping as the transistor 204.

The drain 210 is formed in a lightly doped Nwell region or implant 226. The n-well implant 226 has a contact region 228 that is highly doped negative or N+. The n-well implant 226 and a p-well of the body 216 may be formed by ion implantation. In some embodiments, a p-well implant is formed in the body 216 followed by the n-well 226 implant within the p-well implant of the body 216. The n-well implant 226 is typically a series of chained implants of phosphorus, arsenic and/or antimony to counter dope the p-type body 216 and form the lightly doped n-well implant 226.

Portions of the top surface of the device 200 have silicide layers applied thereto. Examples of silicide materials that form the silicide layers include titanium silicide ($TiSi_2$), tungsten silicide ($WSi_2$), cobalt silicide ($CoSi_2$) and nickel silicide ($NiSi_2$). A silicide layer 250 is shown on top of the gate 212. A silicide layer 252 is shown on the top of the N+ source 224. A silicide layer 254 is shown on top of the P+ contacts 220 and 222 of the body 216. Only a portion of the N+ region 228 of the drain 210 has a silicide layer 256. The remaining top surface of the N+ region 228 of the drain 210 is a silicide-free or a silicide blocked region 258. The silicide blocked region 258 is shown on about 50% of the surface area of the N+ region 228. In other examples, the silicide-free region 258 can comprise 10% to 90% of the surface area of the N+ region 228. The silicide layers are shown as being individual components. However, some of the layers may be connected and they may all be fabricated onto the device 200 in a single process. In some examples, the source 214 and gate 212 do not include silicide layers thereon and are silicide blocked. The source 214 may be silicide blocked to enhance the ESD robustness of the device 200. In some examples, silicide blocking in the form of a silicide mask can be used on a portion of the drain 210 during fabrication so that only the contact area of the drain 210 is silicided as shown by the silicide layer 256. The silicide blocking may be applied to other components (not shown) on the device 200.

Figure 3:
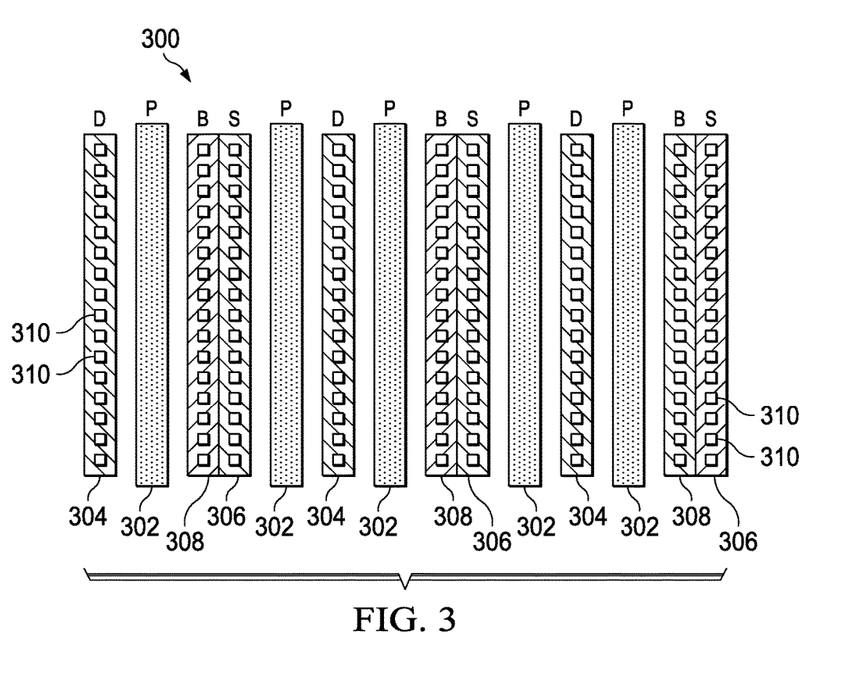
FIG. 3 is a top view of an example of fingers that connect to the drain, source, and body of the device of FIG. 2.

FIG. 3 is a top view of an example of a configuration of fingers 300 that connect to the drain 210, source 213, and body 220, 222 of the device 200, FIG. 2. Each of the fingers 300 includes a poly component 302, a drain component 304, a source component 306, and a body component 308. The drain components 304 associated with the drain 110 are reference with a D. The gate components 302 associated with the gate 112 are typically a poly material and are referenced with a P. The body components 308 associated with the body 220, 222 are referenced with a B. The source components 306 associated with the source are referenced with an S. The example of FIG. 3 is referred to as having five fingers in that there are five poly material fingers and their respective components. The fingers 300 have a plurality of contacts 310 located thereon. The contacts 310 electrically couple the finger components to their respective regions in the device 200.

As described above, the silicide layer 256 may only be adjacent a portion of the N+ region 228 of the drain 210. The drain 210 may have an extended N+ region 228, so a plurality of partially silicided fingers may be adjacent the N+ region 228 or regions. In order to achieve the partial silicide layer 256, a silicide block or mask is located over the silicide blocked portion 258 of the N+ region 228 during fabrication and prior to the application of the silicide layer 256. The mask is subsequently removed leaving the silicide layer 256 and the silicide blocked portion 258 on the N+ portion 228 of the drain 210. A single device 200 may have a plurality of silicide blocked (SBLK) fingers fabricated thereon. A SBLK finger is one that has a SBLK drain component 304. As stated above, some examples have SBLK fingers on the source 214 in addition to the drain 210.

The silicide blocked portions 258 on the highly doped portions N+ 228 of the drain 210 improve the robustness of the devices 200 during ESD events. The silicide blocked portions 258 spread the current resulting from ESD events, which improves scalability of the device 200. For example, the use of silicide block portions 258 on a 20V non-isolated DEMOS device may improve the failure current IT2 resulting from an ESD event from 350 uA/um to 5 mA/um. In order for conventional devices to operate properly, silicide blocking is applied to all the drain components 304 of conventional devices, to fabricate silicide blocked portions 258, which significantly increases the area of the device 200.

The devices described herein overcome the large area problems by having less than all the drain components 304 silicide blocked. These SBLK drain components 304 are triggered during an ESD event so that the current generated during the ESD event flows through the SBLK drain components 304 of the fingers 300. One of the advantages of having fewer than all the drain components 304 silicide blocked is that both the SBLK drain components 304 and the drain components 304 that are not silicide blocked have the same bias conditions during ESD events.

Figure 4:
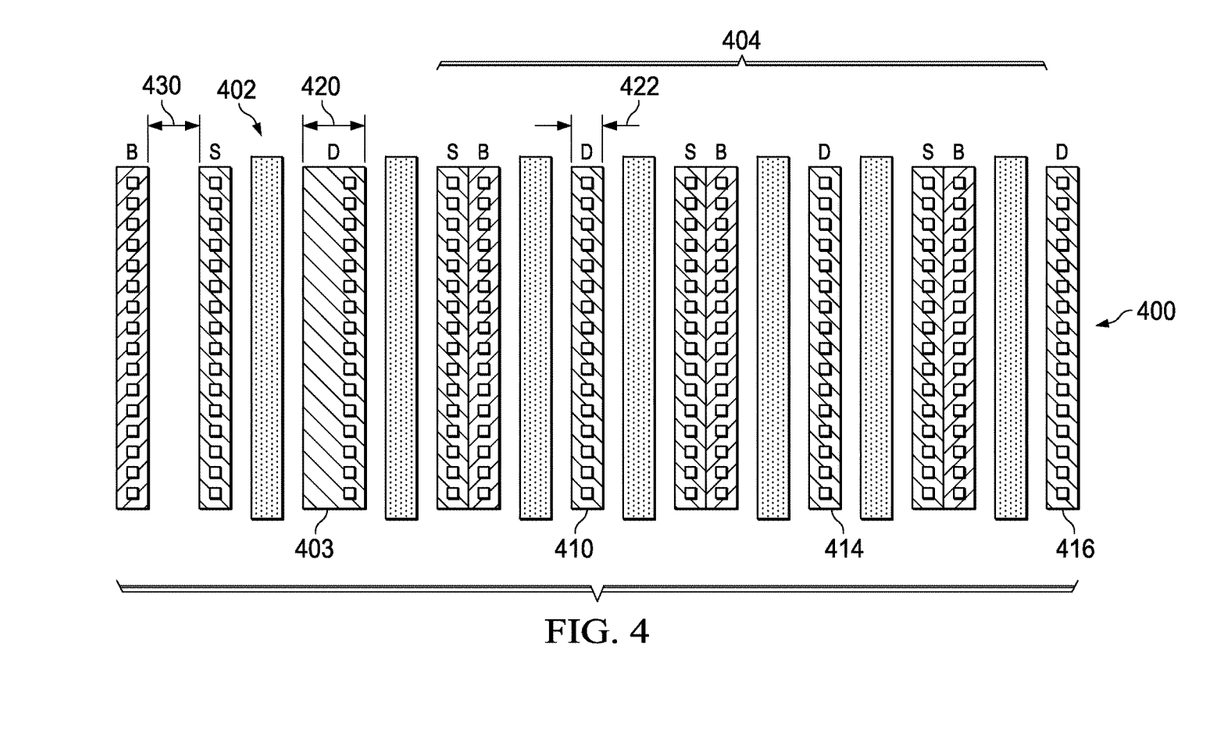
FIG. 4 is a top view of an example of fingers wherein not all of the fingers are silicide blocked and a body component of a finger is located a distance from its corresponding source component.

FIG. 4 is an example of a top view of fingers 400 wherein not all of the drain components are silicide blocked. The layout of the fingers 400 in FIG. 4 is sometimes referred to as having non-integrated body contacts wherein the body and source contacts are not inherently shorted. In the example of FIG. 4, the fingers 400 include a SBLK finger 402 that has a SBLK drain component 403. The fingers 400 also include silicided fingers 404 that have silicided drain components. The silicided drain components of the fingers 404 are referred individually as silicided drain components 410, 414, and 416. The SBLK drain component 403 has a width 420, which is representative of the width of all the SBLK drain components. The silicided drain components of the fingers 404 have widths 422, wherein the width 420 is greater than the widths 422. The widths 420 and 422 of FIG. 4 are greatly exaggerated for illustration purposes. By having fewer than all the drain components of the fingers 400 silicide blocked, the size of the device is smaller than the situation where all the drain components are silicide blocked.

In order for the configuration of FIG. 4 where fewer than all the drain components of the fingers 400 are silicide blocked to function, the SBLK drain component 403 of the finger 402 must trigger before the drain components of the silicided fingers 404 during ESD events. This triggering order is achieved by selectively increasing the body resistance of the SBLK fingers 402. In the layout of FIG. 4, the space between the source and body can be increased for the SBLK finger 402. As shown in FIG. 4, the space 430 between the source and body associated with the SBLK finger 402 is much greater than the space between the sources and bodies associated with the silicided fingers 404. This space 430 causes the resistance that ensures that the SBLK drain component 403 triggers before the silicided drain components of the silicided fingers 404.

Figure 5:
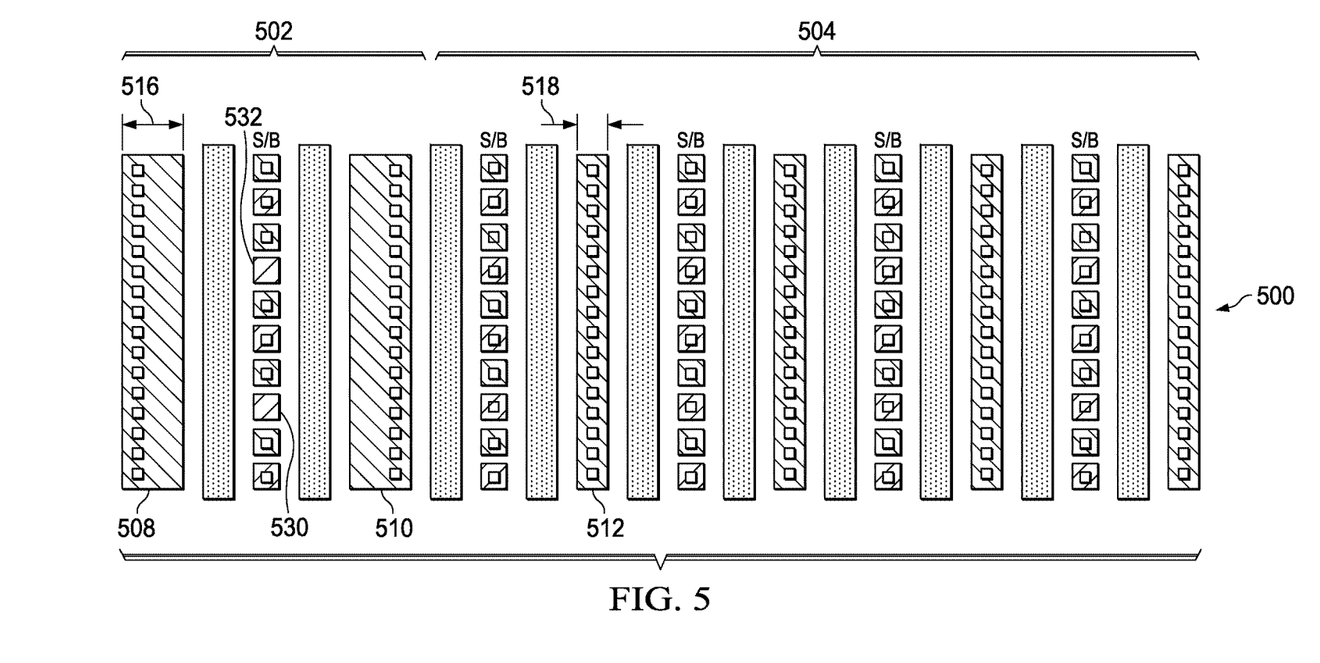
FIG. 5 is a top view of an example of fingers wherein the source and body components are embedded and some of the body contacts on the body component are removed.

FIG. 5 is an example of the layout of fingers 500 in a device with embedded integrated body contacts wherein the body and source are inherently shorted. In the example of FIG. 5, the fingers 500 include SBLK fingers 502 and silicided fingers 504. The drain components of the SBLK fingers 502 are referred to individually as the first SBLK drain component 508 and the second SBLK drain component 510. A first silicided drain component 512 is referenced and is similar or identical to all of the silicided drain components. The source components are noted with negative sloped hatching and the body components are noted with positive sloped hatching. The drain components 508, 510 of the SBLK fingers 502 have widths 516 as noted by the first SBLK drain component 508. The drain components of the silicided fingers 504 have widths 518, wherein the widths 516 are greater than the widths 518. The widths 516 and 518 of FIG. 5 are greatly exaggerated for illustration purposes. By having fewer than all the fingers 500 silicide blocked, the size of the device is smaller than the situation where all the fingers are silicide blocked.

Increasing the body resistance for devices with embedded integrated body contacts such as shown in FIG. 4 may be slightly different than with the non integrated body contacts as shown in FIG. 5. The body resistance can be increased by reducing the number of body contacts. The body contacts are shown as the dots in the squares of FIG. 5. As shown, two body contacts 530 and 532 have been removed from the body component associated with the SBLK finger 502. Different numbers of body contacts may be removed or not fabricated in order to change the body resistance.

Figure 6:
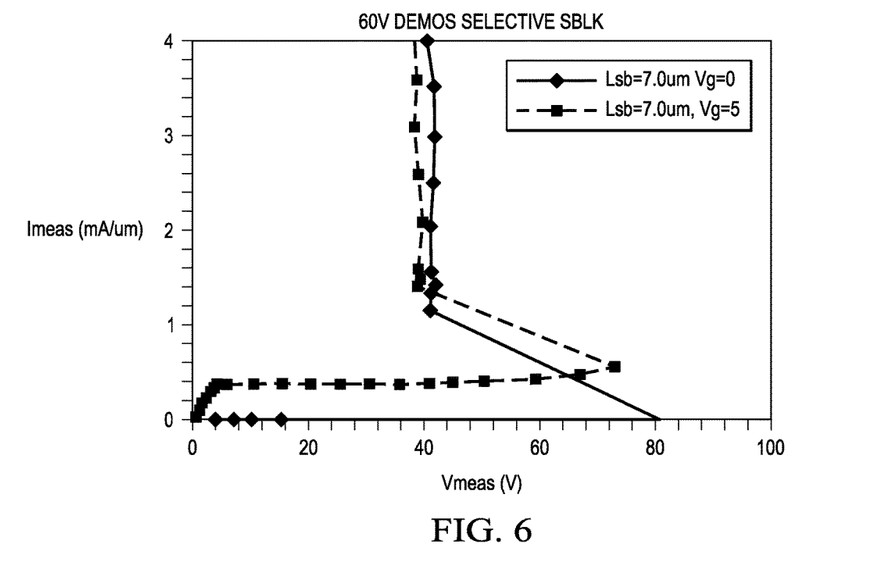
FIG. 6 is a graph showing improved triggering of the device of FIG. 4 wherein the body component and the source component are separated.
Figure 7:
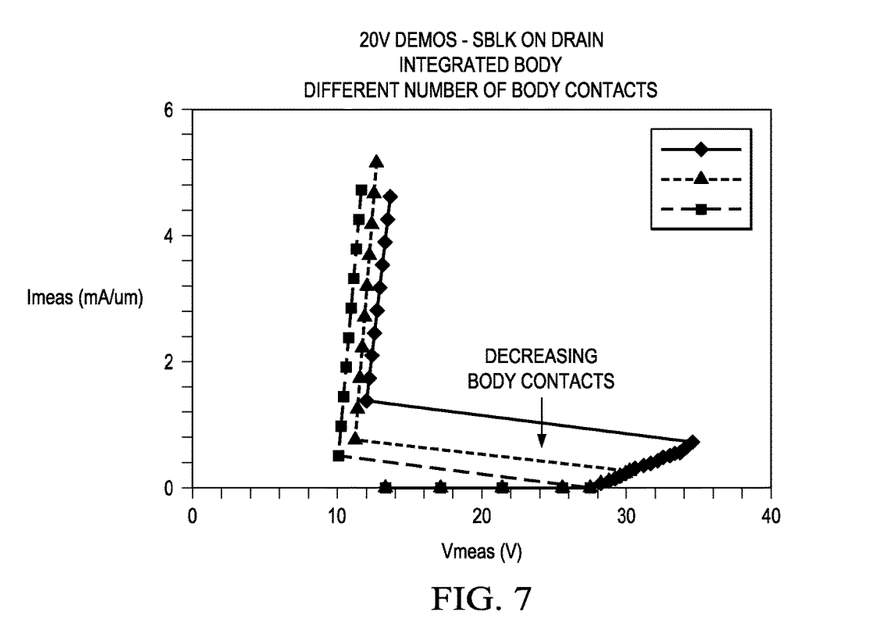
FIG. 7 is a graph showing improved triggering of the device of FIG. 5 wherein some of the body contacts are removed.

The effectiveness of this increasing the body resistance is shown by the graphs of FIG. 6 and FIG. 7. FIG. 6 shows the transmission line pulse (TLP) characteristics of a 60V DEMOS with non-integrated body contacts, such as that of FIG. 4. As shown in FIG. 6, selectively increasing the source to body spacing 430, FIG. 4, of the SBLK finger 402 helps selectively trigger the intended fingers, which is the SBLK drain component 420. As shown by the graph of FIG. 6, increasing the source to body space 430 reduces the trigger voltage and current, thereby ensuring that the SBLK drain component 403 triggers before the silicided drain components. The result is an ESD robust device. The grounded gate TLP characteristic of a multi-finger 20V DEMOS with embedded integrated body contacts, such as those of FIG. 5, is shown by the graph of FIG. 7. In the example of FIG. 7, four out of a total of 20 drain components are silicide blocked and their respective body components have varying numbers of body contacts removed. As can be seen from the graph of FIG. 7, removing some of the body contacts reduces the trigger voltage and current, thereby ensuring that the SBLK drain components trigger before the silicided drain components. The area savings with the selective SBLK fingers is significant. For example, the 20V integrated body DEMOS device that has four SBLK fingers instead of the entire 20 fingers has an area savings of 70%.

Figure 8:
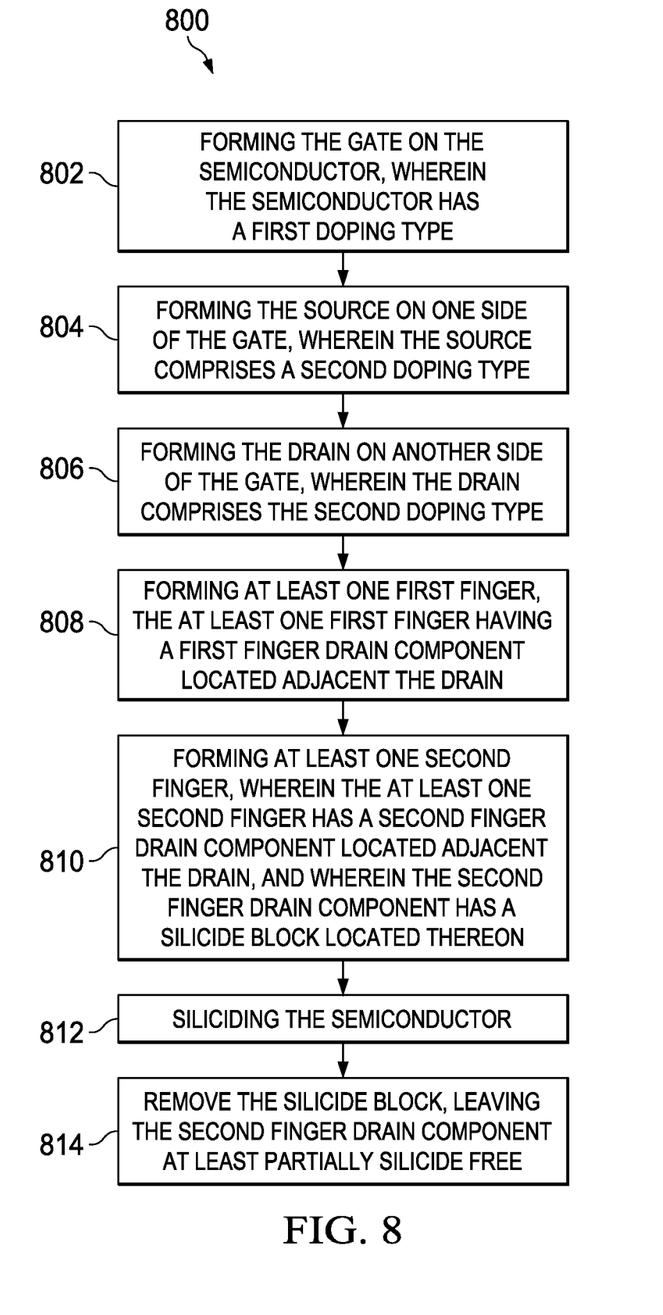
FIG. 8 is a flow chart describing a method of forming a DEMOS device.

FIG. 8 is a flow chart 800 describing a method of fabricating a DEMOS device, such as the device 200 of FIG. 2. The method commences at step 802 with forming the gate 212 on the semiconductor 216, wherein the semiconductor has a first doping type. At step 804, the source 214 is formed on one side of the gate, wherein the source comprises a second doping type. The method continues at step 806 with forming the drain 228 on another side of the gate 212, wherein the drain 210 comprising the second doping type. At step 808, at least one first finger is formed, the at least one first finger having a first finger drain component 304, 403 located adjacent the drain 210. At step 810, at least one second finger is formed, wherein the at least one second finger has a second finger drain component 304, 410 located adjacent the drain 210, and wherein the second finger drain component 304, 410 has a silicide block located thereon. In step 812, the semiconductor is silicided. The silicide block is removed in step 814, leaving the second finger drain portion at least partially silicide free.

While illustrative and presently preferred embodiments of the disclosure have been described in detail herein, it is to be understood that the inventive concepts may be otherwise variously embodied and employed and that the appended claims are intended to be construed to include such variations except insofar as limited by the prior art.

What is claimed is:

1. A drain extended metal oxide semiconductor (MOS) comprising:
   a substrate having a semiconductor;
   a gate located on the semiconductor;
   a source located on the semiconductor and on one side of the gate;
   a drain located on the semiconductor and on another side of said gate;
   at least one first finger, the at least one first finger having a first finger drain component located adjacent the drain, the first finger drain component having a silicide layer; and
   at least one second finger, the at least one second finger having a second finger drain component located adjacent the drain, the second finger drain component having less silicide than the first finger drain component, wherein the first finger drain component is physically separated from the second finger drain component by at least one gate component.

2. The drain extended MOS of claim 1 wherein the first finger drain component has a first width and the second finger drain component has a second width, and wherein the second width is greater than the first width.

3. The drain extended MOS of claim 1 and further comprising a body located on the substrate, wherein the at least one first finger has a first body component that is coupled to the body, wherein the at least one second finger has a second body component that is coupled to the body, and wherein the resistance of the first body component is less than the second body component.

4. The drain extended MOS of claim 1 and further comprising a body located on the substrate, wherein the at least one first finger has a first body component that is coupled to the body by way of a first plurality of body contacts, wherein the at least one second finger has a second body component that is coupled to the body by way of a second plurality of body contacts, and wherein the first plurality of body contacts is greater than the second plurality of body contacts.

5. The drain extended MOS of claim 1 and further comprising a body located on the substrate, wherein the at least one first finger has a first body component that is coupled to the body by way of a first plurality of body contacts, wherein the at least one second finger has a second body component that is coupled to the body by way of a second plurality of body contacts, and wherein the first body contact and the second body contact are silicided.

6. The drain extended MOS of claim 1, wherein the drain extended MOS is an n-channel MOS transistor having an Nwell region in the semiconductor between the gate and the drain.

7. The drain extended MOS of claim 1 and further comprising a body located on the substrate and isolation at least partially encasing the body.

8. The drain extended MOS of claim 1, wherein the drain is a highly doped portion of the substrate.

9. The drain extended MOS of claim 1, wherein the source is a highly doped portion of the substrate.

10. The drain extended MOS of claim 1, wherein the at least one first finger has a body component spaced a first distance from a source component; wherein the at least one second finger has a body component spaced a second distance from a source component; and wherein the second distance is greater than the first distance.

11. The drain extended MOS of claim 1, wherein the at least one second finger has a body component with a resistance coupled thereto, and wherein the at least one first finger has a body component without a resistance coupled thereto.

12. The drain extended MOS of claim 1 wherein the second finger drain component is silicide free.

13. The drain extended MOS of claim 1, wherein the second finger drain component is silicide blocked during fabrication of the drain extended MOS.

14. A method of forming a drain extended metal oxide semiconductor (MOS), the method comprising:
    forming a gate on a semiconductor, the semiconductor portion having a first doping type;
    forming a source on one side of the gate, the source comprising a second doping type;
    forming a drain on another side of the gate, the drain comprising the second doping type;
    forming at least one first finger, the at least one first finger having a first finger drain component located adjacent the drain;
    forming at least one second finger, the at least one second finger having a second finger drain component located adjacent the drain portion, the second finger drain component having a silicide block located thereon, wherein the first finger drain component is physically separated from the second finger drain component by a gate component of the gate;
    siliciding the semiconductor; and
    removing the silicide block, leaving the second finger drain portion at least partially silicide free.

15. The method of claim 14 wherein forming the at least one second finger includes forming the area of the first finger drain component to be less than the area of the second drain component to accommodate silicide block.

16. The method of claim 14, wherein forming the second finger drain component comprises forming the second finger drain component with a higher resistance than the resistance of the first finger drain component.

17. The method of claim 14, wherein forming at least one first finger comprises forming a first body component having a first plurality of body contacts; wherein forming at least one second finger comprises forming a second body component having a second plurality of body contacts; wherein the first plurality of body contacts is greater than the second plurality of body contacts.

18. The method of claim 14, wherein forming at least one first finger comprises forming a first body component located a first distance from a first source component; wherein forming at least one second finger comprises forming a second body component a second distance from a second source component; wherein the first distance is less than the second distance.

19. The method of claim 14, wherein forming at least one second finger comprises forming a body component and forming a resistance coupled in series with the body component.

20. A drain extended metal oxide semiconductor (MOS) comprising:
    a substrate having a semiconductor comprising a first doping type;
    a gate located on the semiconductor;
    a source located on the semiconductor on one side of the gate, the source comprising a second doping type;
    a drain located on the semiconductor and on another side of said gate, the drain having the second doping type;
    at least one first finger, the at least one first finger having a first finger drain component located adjacent the drain, the first finger drain component having a silicide layer;
    a first body component associated with the at least one first finger, the first body component having a first resistance associated therewith;
    at least one second finger, the at least one second finger having a second finger drain component located adjacent the drain, the second finger drain component having less silicide than the first finger drain component, wherein the first finger drain component is physically separated from the second finger drain component by a gate component of the gate; and
    a second body component associated with the at least one second finger, the second body component having a second resistance associated therewith, wherein the second resistance is greater than the first resistance.

* * * * *